(12) United States Patent
Ando et al.

(10) Patent No.: US 8,975,747 B2
(45) Date of Patent: Mar. 10, 2015

(54) WIRING MATERIAL AND SEMICONDUCTOR MODULE USING THE SAME

(75) Inventors: Takashi Ando, Tokyo (JP); Ryoichi Kajiwara, Tokyo (JP); Hiroshi Hozoji, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/238,376

(22) PCT Filed: Aug. 13, 2012

(86) PCT No.: PCT/JP2012/070616
§ 371 (c)(1),
(2), (4) Date: Feb. 11, 2014

(87) PCT Pub. No.: WO2013/046966
PCT Pub. Date: Apr. 4, 2013

(65) Prior Publication Data
US 2014/0191399 A1   Jul. 10, 2014

(30) Foreign Application Priority Data

Sep. 30, 2011   (JP) ................................ 2011-215898

(51) Int. Cl.
| H01L 23/14 | (2006.01) |
| H01L 23/48 | (2006.01) |
| H01L 23/498 | (2006.01) |
| H01L 21/60 | (2006.01) |

(Continued)

(52) U.S. Cl.
CPC .......... *H01L 23/49866* (2013.01); *H01L 24/34* (2013.01); *H01L 24/73* (2013.01); *H01L 23/142* (2013.01); *H01L 23/3735* (2013.01); *H01L 23/3736* (2013.01); *H01L 23/49537* (2013.01); *H01L 23/49562* (2013.01); *H01L 23/49582* (2013.01); *H01L 23/49575* (2013.01);
(Continued)

(58) Field of Classification Search
USPC ......... 257/746, 202, 203, 208, 211, 758, 698, 257/773, 668; 174/126.2
See application file for complete search history.

(56) References Cited

U.S. PATENT DOCUMENTS 7,943,199 B2 *   5/2011   Kano et al. .................... 427/384
7,968,803 B2 *   6/2011   Higashitani ................... 174/264
(Continued)

FOREIGN PATENT DOCUMENTS

JP   2005-200676 A   7/2005
JP   2006-351737 A   12/2006
(Continued)

OTHER PUBLICATIONS

PCT International Search Report on application PCT/JP2012/070616 mailed Oct. 16, 2012; 1 page.

*Primary Examiner* — Alexander Oscar Williams
(74) *Attorney, Agent, or Firm* — Foley & Lardner LLP

(57) ABSTRACT

There is provided a wiring material including a core layer made of metal and a clad layer made of metal and a fiber in which the core layer is copper or an alloy containing copper and the clad layer is formed of copper or the alloy containing copper and the fiber having a thermal expansion coefficient lower than that of copper, the wiring material having a stacked structure in which at least one surface of the core layer is closely adhered to the clad layer, and the fiber in the clad layer is arranged so as to be parallel to the surface of the core layer.

15 Claims, 6 Drawing Sheets

(51) Int. Cl.
*H01L 23/00* (2006.01)
*H01L 23/373* (2006.01)
*H01L 23/495* (2006.01)

(52) U.S. Cl.
CPC .... *H01L23/49579* (2013.01); *H01L 23/49811* (2013.01); *H01L 2224/32225* (2013.01); *H01L 2224/48227* (2013.01); *H01L 2224/73265* (2013.01); *H01L 2224/45124* (2013.01); *H01L 2224/48091* (2013.01); *H01L 2924/13055* (2013.01); *H01L 2224/73221* (2013.01); *H01L 2224/8384* (2013.01); *H01L 2224/40137* (2013.01); *H01L 2224/40139* (2013.01); *H01L 2224/40227* (2013.01)
USPC ........... 257/746; 257/208; 257/202; 257/211; 257/758; 257/698; 257/773; 257/668; 174/126.2

(56) References Cited

U.S. PATENT DOCUMENTS

| | | |
|---|---|---|
| 2007/0111383 A1 | 5/2007 | Houle et al. |
| 2008/0248309 A1 | 10/2008 | Ono et al. |
| 2013/0071686 A1* | 3/2013 | Oda et al. ...................... 428/652 |
| 2013/0118791 A1* | 5/2013 | Okamoto ...................... 174/260 |
| 2013/0186672 A1* | 7/2013 | Kariya et al. ............. 174/133 R |

FOREIGN PATENT DOCUMENTS

| | | |
|---|---|---|
| JP | 2008-085106 | 4/2008 |
| JP | 2009-158611 A | 7/2009 |
| JP | 2010-010502 A | 1/2010 |
| WO | WO 2006/051782 A1 | 5/2006 |

* cited by examiner

WIRING MATERIAL AND SEMICONDUCTOR MODULE USING THE SAME

TECHNICAL FIELD

The present invention relates to a wiring material with small thermal expansion having high electrical conductivity applied to a power semiconductor module and the like and a semiconductor module using the same.

BACKGROUND ART

A power semiconductor module composed of an IGBT power device, which performs switching control of a large current, and a diode, which releases an inverse voltage generated at the time of switching, is used in a wide range of fields such as home electric appliances and vehicles as a principal component of a power converter (inverter). Especially, electrically-powered vehicles are promoted and an environment in which the power semiconductor module is used becomes severe, so that this is used under a high-temperature atmosphere in which cooling cannot be sufficiently performed, and current capacity to be controlled is increasing. Therefore, as performance of the power semiconductor module, high reliability for securing normal operation for a long period of time in a usage environment with a large temperature change and a high heat resistance property to resist high temperature of a device due to an increase in heat generation amount from a device associated with large current energization are required.

In a conventional power semiconductor module, an insulating circuit substrate of ceramic and the like is joined onto a base substrate having high thermal conductivity formed of a Cu-based or Al-based material by soldering and the like, and an electrode surface of a semiconductor device is joined onto Al or Cu circuit wiring forming the insulating circuit substrate by means of soldering. Further, Al or Cu wire wiring is connected to a main electrode terminal on an electrode surface opposite to the surface, which is in contact with a circuit surface, of the semiconductor device (PTL 1, for example). In a conventional structure, a thermal stress applied to a joint part between the semiconductor device and the wiring or between the base substrate and the insulating circuit substrate increases along with the increase in heat generation amount from the device and this generates a crack in a solder layer to break the joint part. A thermal expansion coefficient of the base substrate and a wiring material is five to eight times larger than that of the semiconductor device and the ceramic insulating substrate, so that the stress and a strain of the joint part increase to cause the break of the joint part. Especially, a shearing stress applied on the same plane as a joint interface has a major effect on the break of the joint part. In order to decrease the shearing stress applied on the same plane as the joint interface, it is required to decrease the thermal expansion coefficient of the base substrate and the wiring material to a level comparable to the thermal expansion coefficient of the semiconductor device and the ceramic insulating substrate at least in a joint region.

As the wiring, the wiring material obtained by mixing a nano power or a nano fiber having a low thermal expansion coefficient with Cu is applied in PTL 1 and the wiring material obtained by impregnating a fiber having a low thermal expansion coefficient with Cu is applied in PTL 2. They are obtained by combination of a material having a low thermal expansion coefficient with an entire conductive material such as Cu. There are C, W, Mo and the like as the material having the low thermal expansion coefficient; electrical conductivity of such materials having the low thermal expansion coefficient is ½ or lower of that of Cu, Al and the like conventionally used as the wiring material. Although a specific content rate of the material having the low thermal expansion coefficient is not disclosed in PTLs 1 and 2, it is easily considered that the combination of the material having the low thermal expansion coefficient makes the electrical conductivity lower than that of the conventional wiring material to cause an increase in loss of current.

CITATION LIST

Patent Literature

PTL 1: JP 2006-351737 A
PTL 2: JP 2009-158611 A

SUMMARY OF INVENTION

Technical Problem

As disclosed in PTLs 1 and 2, a low thermal expansion conductive material is formed by combining a particle having a low thermal expansion coefficient such as ceramic and carbon with a Cu-based or Al-based conductive material. It is easy to realize a property of a low thermal expansion coefficient and high thermal conductivity of the wiring material and it is considered that this may be used as a base substrate having high thermal conductivity. However, it is difficult to use the same as the wiring material of which high electrical conductivity is required capable of decreasing a shearing stress applied on a joint surface to a semiconductor device.

An object of the present invention is to provide the wiring material satisfying both of high electrical conductivity and improvement in reliability of a joint part by decrease in thermal stress applied to the joint part between the semiconductor device and the wiring material and between the ceramic and the base substrate also in a case in which an ambient temperature of semiconductor equipment increases by an exterior cause or heat generated in the semiconductor device becomes high.

Solution to Problem

According to the present invention, there is provided a wiring material including a core layer made of metal and a clad layer made of metal and a fiber, wherein the core layer is copper or an alloy containing copper, the clad layer is formed of copper or the alloy containing copper and the fiber having a thermal expansion coefficient lower than a thermal expansion coefficient of copper, the wiring material has a stacked structure in which at least one surface of the core layer is closely adhered to the clad layer, and the fiber in the clad layer is arranged so as to be parallel to the surface of the core layer.

Further, the present invention provides a semiconductor module including: a wiring material including a core layer made of metal and a clad layer made of metal and a fiber; a semiconductor device including an electrode; and an insulating circuit substrate including a metal layer, wherein the clad layer is formed of copper or an alloy containing copper and a fiber having a thermal expansion coefficient lower than that of copper, the wiring material has a stacked structure in which at least one surface of the core layer is closely adhered to the clad layer, the semiconductor device is mounted on the insulating circuit substrate, an electrode of the semiconductor device and the core layer of the wiring material are connected to each other through the clad layer, and the metal layer of the insulating circuit substrate and the core layer of the wiring material are connected to each other through the clad layer.

Advantageous Effects of Invention

According to the present invention, it is possible to provide a wiring material having high electrical conductivity in which reliability of a joint part is improved by decreasing a thermal stress applied to the joint part between a semiconductor device and a wiring material and between an insulating circuit substrate and a radiating base having high thermal conductivity also in a case in which an ambient temperature of semiconductor equipment increases by an exterior cause or heat generated in the semiconductor device becomes high, a radiating base substrate, and a semiconductor module using the same.

Another object, feature and advantage of the present invention will become clear from following description in examples of the present invention related to the attached drawings.

DESCRIPTION OF EMBODIMENTS

Next, a first embodiment for carrying out the present invention is described.

Figure 1A:
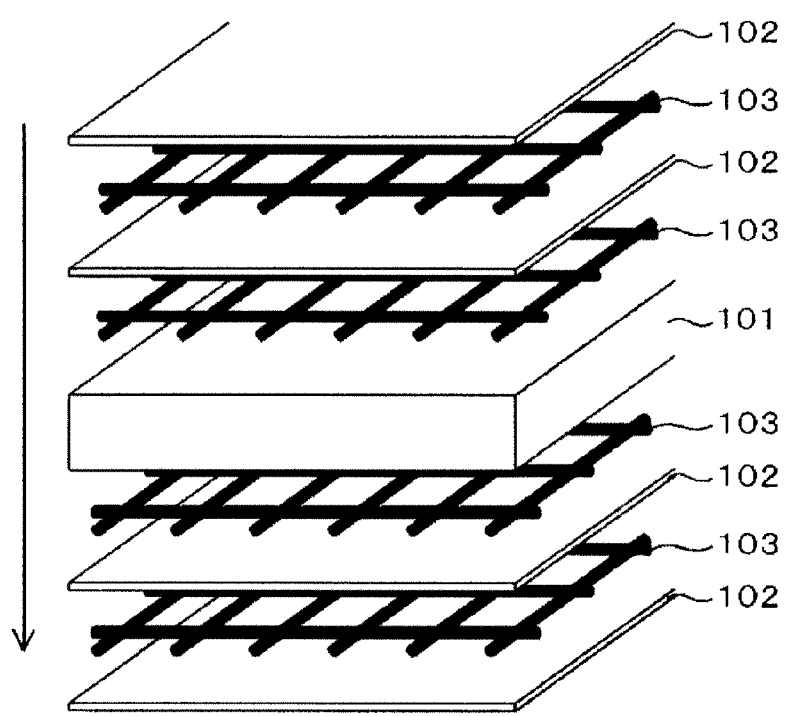
FIG. 1A illustrates a configuration of a wiring material according to a first embodiment of the present invention.
Figure 1B:
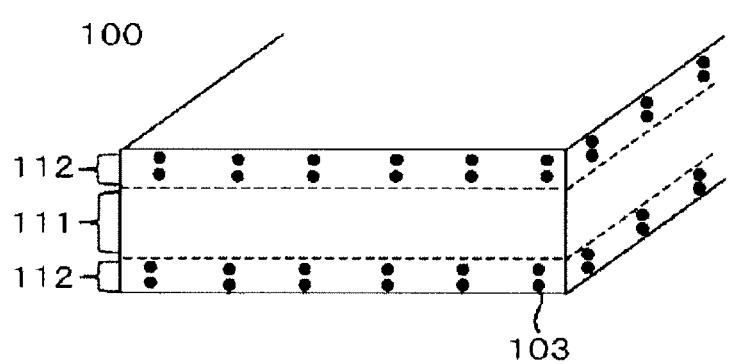
FIG. 1B illustrates a structure after heat pressure welding of the wiring material in FIG. 1A.

FIGS. 1A and 1B are views illustrating a configuration of a wiring material according to this embodiment. As illustrated in FIG. 1A, a conductive thin plate 102 and a fiber layer in which fibers 103 having a thermal expansion coefficient lower than that of a core material are orthogonally arranged are sequentially stacked on both surfaces of a conductive core material 101. A wiring material 100 in which a clad layer 112 composed of the thin plate 102 and the fiber 103 is closely adhered to both surfaces of a core layer 111 composed of the core material 101 is obtained by heat pressure welding of this stacked body.

Metal excellent in electrical conductivity or a material containing the metal is suitable as the core material 101. Specifically, Cu or an alloy containing Cu, or Al or an alloy containing Al is suitable. Especially, Cu having a lower thermal expansion coefficient and higher electrical conductivity than those of Al is desirable and oxygen-free copper is further desirable.

The metal excellent in electrical conductivity or a wiring material containing the metal is suitable as the conductive thin plate 102. Specifically, Cu or the alloy containing Cu, or Al or the alloy containing Al is suitable. Especially, Cu having the lower thermal expansion coefficient and higher electrical conductivity than those of Al is desirable. The thin plate 102 is desirably thinner and the fiber 103 is desirably thicker than an outer diameter of the fiber 103 within a range from 10 μm to 200 μm.

A material having a lower thermal expansion coefficient and higher rupture strength than those of the core material 101 and the thin plate 102 is suitable as the fiber 103. For example, an acrylic or pitch-based carbon fiber, a glass fiber, an Invar wire, a tungsten wire, and a molybdenum wire are suitable. The outer diameter of the fiber 103 is desirably within a range from 1 μm to 200 μm.

It is possible to make an effective thermal expansion coefficient of the clad layer 112 such that an in-plane thermal expansion coefficient of the fiber layer is lower than the thermal expansion coefficient in a stacking direction of the core layer 111 and the clad layer 112 by arranging at least one fiber layer in which the fibers 103 are arranged in two directions in the clad layer 112. At that time, arranging the fiber continuous from one end to the other end of the wiring material 100 realizes a larger effect to decrease the thermal expansion coefficient in a direction perpendicular to the stacking direction of the wiring material 100.

A surface of the clad layer 112 is covered with the conductive thin plate 102 and the fiber 103 is not exposed, so that surface treatment such as plating is easily applied.

Although the fiber layer in which the low thermal expansion fibers 103 are orthogonally arranged is stacked in this embodiment, there is no limitation. For example, it is possible to decrease the in-plane thermal expansion coefficient of the fiber layer also by forming a pair of fiber layers composed of a first fiber layer in which the fibers 103 are arranged so as to be parallel to one another in one direction and a second fiber layer in which the fibers are arranged so as to be parallel to one another in a direction 90 degrees different from the direction of the first fiber layer.

It becomes possible to effectively decrease the in-plane thermal expansion coefficient of the clad layer 112 by stacking a plurality of fiber layers in which the fibers 103 are arranged. Further, when the fiber layers are stacked, it is possible to allow the thermal expansion coefficients to be distributed in a thickness direction in the clad layer 112 by widening an interval between the fibers in each layer such that volume density of the fiber decreases in a direction toward the core layer 111, thereby decreasing a strain generated at a boundary between the core layer 111 and the clad layer 112.

In the clad layer 112, the in-plane thermal expansion coefficient of the fiber layer may be adjusted by an arrangement interval between the fibers 103. Narrowing the arrangement interval between the fibers 103 increases a volume content rate of the fiber 103 in the clad layer 112, thereby effectively decreasing the thermal expansion coefficient. However, when the volume content rate of the fiber 103 is too much increased, the electrical conductivity decreases. In order to satisfy both of the low in-plane thermal expansion coefficient of the fiber layer and high electrical conductivity of the wiring material 100, a volume fraction of the fiber 103 in the clad layer 112 provided on the both surfaces is desirably 5 to 30%. The high electrical conductivity of the wiring material 100 is realized by setting a total thickness of the clad layer 112 the same as a thickness of the core layer 111 or smaller than this and setting the volume fraction of the fiber 103 in the wiring material composed of the core layer 111 and the clad layer 112 to 2.5 to 20%.

It is also possible to arrange the fiber having a large aspect ratio such that a longitudinal direction of the fiber is substantially perpendicular to the stacking direction of the core layer 111 and the clad layer 112 as another method of forming the clad layer 112. In this case, when orientation directions of the fibers are set in one direction, a direction in which the thermal expansion coefficient is high and a direction in which the thermal expansion coefficient is low are included in the in-plane direction of the clad layer 112, so that an even thermal expansion coefficient in the in-plane direction of the clad layer cannot be realized. Therefore, it is desirable that the aspect ratio (length/diameter) of the fiber is not smaller than 100 and the orientation directions are not set in one direction in order to realize the high electrical conductivity while decreasing the thermal expansion coefficient.

An effect of low thermal expansion cannot be obtained when the clad layer is too thin and the electrical conductivity decreases when this is too thick, so that a ratio of the thickness to the thickness of the core layer should be set appropriately. Specifically, the thickness of the clad layer is preferably set to 1/10 to 1/2 of the thickness of the core layer.

Although the wiring material 100 is obtained by sequentially stacking the conductive thin plate 102 and the fiber layer in which the fibers 103 having the thermal expansion coefficient lower than that of the core material are orthogonally arranged on the both surfaces of the conductive core material 101 and performing the heat pressure welding in this embodiment, there is no limitation. For example, it is also possible to arrange at least one fiber layer on the surface of the core layer 111 and fill the fiber layer with paste containing a metal particle, and thereafter apply heat and pressure to integrate them to form the clad layer 112.

Although the clad layer 112 composed of the thin plate 102 and the fiber 103 is closely adhered to the both surfaces of the core layer 111 composed of the core material 101 in this embodiment, a method is not limited thereto. It is also possible to prepare a sheet obtained by sintering a mixed powder of a copper powder and the fiber having the aspect ratio of 100 or larger and thereafter perform heat pressure welding of the sheet to the core material 101.

As the wiring material 100 obtained in this embodiment, the wiring material with smaller thermal expansion than Cu having higher electrical conductivity than that of Al may be composed when the thermal expansion coefficient of the clad layer 112 in the direction perpendicular to the stacking direction of the core layer 111 and the clad layer 112 is $1 \times 10^{-6}$ to $10 \times 10^{-6}$/K and the electrical conductivity of the wiring material 100 is $40 \times 10^6$ to $60 \times \times 10^6$/mΩ.

If the wiring material 100 of this embodiment joins to a material having a thermal expansion coefficient of $10 \times 10^{-6}$/K or lower, a function of a joint product is improved. Specifically, a thermal expansion coefficient of a semiconductor device such as Si and a Si compound semiconductor, and oxide or nitride ceramic substrate is $2 \times 10^{-6}$ to $8 \times 10^{-6}$/K.

Although a region in which the clad layer 112 is formed is not referred to in this embodiment, the clad layer of the wiring material 100 may be at least formed in a joint region to an electrode of the semiconductor device or a ceramic insulating substrate.

Solder containing Pb and Sn, a sintered body containing Ag and Cu, an alloy layer containing Sn and the like may be applied to join the wiring material 100 of this embodiment to the electrode of the semiconductor device or the ceramic insulating substrate. Among others, the sintered body containing Ag and Cu has a lower thermal expansion coefficient and higher electrical conductivity than those of another joint layer and has an excellent joining characteristic to the surface of the clad layer 112 of the wiring material 100. Further, it becomes possible to realize a low thermal expansion sintered layer by mixing a particle having a low thermal expansion coefficient such as $Al_2O_3$, $SiO_2$, SiN, and AlN with an Ag particle and a Cu particle. As the joint layer is thinner, an effect of low thermal expansion on a joint interface is larger. Specifically, a thickness is desirably 1 to 50 μm.

It becomes possible to decrease a shearing stress applied on the same plane as the joint interface, which has a significant effect on break of a joint part, by joining the wiring material 100 of the present invention to the electrode of the semiconductor device. Especially, when an operational temperature of the semiconductor device reaches 175° C. to 300° C., an effect to decrease the stress is significant.

The wiring material 100 of the present invention has higher thermal conductivity in addition to the lower thermal expansion coefficient and higher electrical conductivity than those of Al. Therefore, this may be used not only as the wiring material but also as a radiating base substrate.

The wiring material of the present invention may be used as the wiring material used in a semiconductor module for driving a semiconductor device for power converter used in a power converting system for home electric appliances, vehicles, wind-power/photovoltaic generation, railroads, and industrial equipment and an optical semiconductor device accompanied with heat generation such as an LED or as the radiating base substrate.

[First Embodiment]

A configuration and a method of preparing a wiring material illustrated in FIGS. 1A and 1B are described in this embodiment.

As illustrated in FIG. 1A, a conductive thin plate 102 and a fiber layer in which fibers 103 having a thermal expansion coefficient lower than that of a core material are orthogonally arranged are sequentially stacked on both surfaces of a conductive core material 101 to prepare a wiring material 100. As the core material 101, 99.95% pure oxygen-free copper having a size of 10 mm×50 mm×0.25 mm (thickness) is used, and as the conductive thin plate 102, 99.95% pure oxygen-free copper having a size of 10 mm×50 mm×0.05 mm (thickness) is used. As the fiber 103, a pitch-based carbon fiber having a diameter of 0.02 mm is used. The fiber layer is formed by orthogonally arranging 74 fibers 103 in a short side direction and 382 fibers 103 in a long side direction of the core material 101 at regular intervals within a range of 10 mm×50 mm.

Although not illustrated, Cu metallization treatment is applied to a surface of the fiber 103.

The thin plate 102, the fiber layer, the thin plate 102, the fiber layer, the core material 101, the fiber layer, the thin plate 102, the fiber layer, and the thin plate 102 are stacked in this order to form a stacked body. The stacked body is pressure bonded by hot pressing for 20 minutes at a temperature of 1000° C. with a load of 30×10$^6$ Pa applied thereto in a reducing atmosphere of nitrogen and hydrogen. As a result, the wiring material 100 as illustrated in FIG. 1B is obtained. The wiring material 100 is composed of a core layer 111 having a thickness of 0.25 mm and a clad layer 112 having a thickness of 0.125 mm on both surfaces of the core layer 111. Since the clad layers 112 are simultaneously formed on both surfaces of the core layer 111, there is no warpage of the wiring material 100. A volume fraction of the carbon fiber 103 in the clad layer 112 is approximately 20% and the volume fraction of the carbon fiber 103 in the wiring material 100 is approximately 10%. Electrical conductivity of the wiring material 100 is measured to be approximately 50×10$^6$/mΩ in the long side direction. For comparison, electrical conductivity of an Al plate having a size of 10 mm×50 mm×0.5 mm is measured to be 36×10$^6$/mΩ, so that the wiring material having electrical conductivity higher than that of Al is obtained. Since a surface of the obtained wiring material is Cu, a joining characteristic to a joint material is improved and surface treatment such as plating for preventing corrosion becomes easier. Meanwhile, it is possible to change a thermal expansion coefficient of the clad layer by changing the number of fibers 103 and a material of the fiber 103 as described in a second embodiment to be described later. In this example, the thermal expansion coefficient of the clad layer is 5.5 to 7×10$^{-6}$/K. Meanwhile, it is also possible to change a fiber volume fraction in the clad layer so as to obtain an appropriate thermal expansion coefficient as described in the second embodiment.

As in this embodiment, it is possible to effectively decrease the thermal expansion coefficient of the clad layer 112 and realize the high electrical conductivity by using the fiber layer and the thin plate 102 to make a structure including a plurality of fiber layers and thin plates 102.

[Second Embodiment]

In this embodiment, a material configuration and a manufacturing method for evaluating a thermal expansion coefficient in a direction perpendicular to a stacking direction of a core material 101 and a clad layer 112 and an evaluation result in a wiring material as described in the first embodiment are described. In this embodiment, the wiring material in which the clad layer 112 is formed on only one surface of the core material 101 is experimentally produced.

Configurations of wiring materials A to E for evaluating the thermal expansion coefficient are indicated in Table 1. A conductive thin plate 102 and a fiber layer in which fibers 103 having a thermal expansion coefficient lower than that of the thin plate 102 are orthogonally arranged are sequentially stacked on one surface of the conductive core material 101 to compose the wiring material. As the core material 101 and the conductive thin plate 102, 99.95% pure oxygen-free copper is used. As the fiber 103, a pitch-based carbon fiber having a diameter of 0.02 mm is used. The fiber layer is formed by orthogonally arranging the fibers 103, the number of which is indicated in Table 1, at regular intervals within a range of 10 mm×50 mm. Cu metallization treatment is applied to a surface of the fiber 103.

TABLE 1

|  | Samples | | | | |
| --- | --- | --- | --- | --- | --- |
|  | A | B | C | D | E |
| Size of core material and conductive thin plate (mm) | 10 × 50 × 0.05 | ← | ← | ← | ← |
| Diameter of fiber (mm) | 0.02 | 0.02 | 0.02 | 0.02 | 0.02 |
| Number of fibers (in short side direction) | 14 | 31 | 74 | 126 | 198 |
| Number of fibers (in long side direction) | 78 | 164 | 382 | 639 | 998 |
| Size of wiring material (mm) | 10 × 50 × 0.16 | 10 × 50 × 0.17 | 10 × 50 × 0.18 | 10 × 50 × 0.2 | 10 × 50 × 0.22 |
| Fiber volume fraction in clad layer (%) | 5 | 10 | 20 | 30 | 40 |

A stacked body in which the thin plate 102, the fiber layer, the thin plate 102, the fiber layer, and the core material 101 are stacked in this order is formed. The stacked body is pressure bonded by hot pressing for 20 minutes at a temperature of 1000° C. with a load of 30×10$^6$ Pa applied thereto in a reducing atmosphere of nitrogen and hydrogen. As a result, the wiring materials A to E having the sizes and fiber volume fractions indicated in Table 1 are obtained.

The thermal expansion coefficient in the direction perpendicular to the stacking direction of the core layer and the clad layer and electrical conductivity are measured in the obtained wiring materials. A measured temperature range is 50° C. to 250° C. Measured results of the thermal expansion coefficient and the electrical conductivity are indicated in Table 2. For comparison, an oxygen-free copper material used as the core material 101 and the conductive thin plate 102 is processed into a size of 10 mm×50 mm×0.2 mm and a thermal expansion coefficient thereof is measured; this is approximately 17×10$^{-6}$/K, so that the wiring material having a thermal expansion coefficient in the direction perpendicular to the stacking direction of the core material and the clad layer lower than that of the core material is obtained. The samples A to D have electrical conductivity higher than electrical conductivity (36×10$^6$/mΩ) of an Al plate.

TABLE 2

|  | Samples | | | | |
| --- | --- | --- | --- | --- | --- |
|  | A | B | C | D | E |
| Thermal expansion coefficient (×10$^{-6}$/K) | 12 to 13 | 8 to 9.5 | 5.5 to 7 | 2.5 to 3.5 | 0.5 to 1.5 |
| Electrical conductivity (×10$^6$/mΩ) | 56 to 57 | 53 to 54 | 48 to 50 | 41 to 43 | 33 to 36 |

The above-described result shows that it is possible to prepare the wiring material having the thermal expansion coefficient of $10\times10^{-6}$/K or lower in the direction perpendicular to the stacking direction of the core layer and the clad layer and electrical conductivity of $40\times10^6$/mΩ or higher by adjusting the diameter of the fiber, the number of fibers, and the thickness of the conductive thin plate such that the fiber volume fraction in the clad layer is set to 10 to 30%.

[Third Embodiment]

Difference from the first embodiment is described in this embodiment. This embodiment is different from the first embodiment in that a clad layer 152 of this embodiment is configured such that a portion closer to a core layer 111 has a higher thermal expansion coefficient, in other words, the thermal expansion coefficient of the clad layer 152 becomes lower with distance from the core layer 111.

Figure 8A:
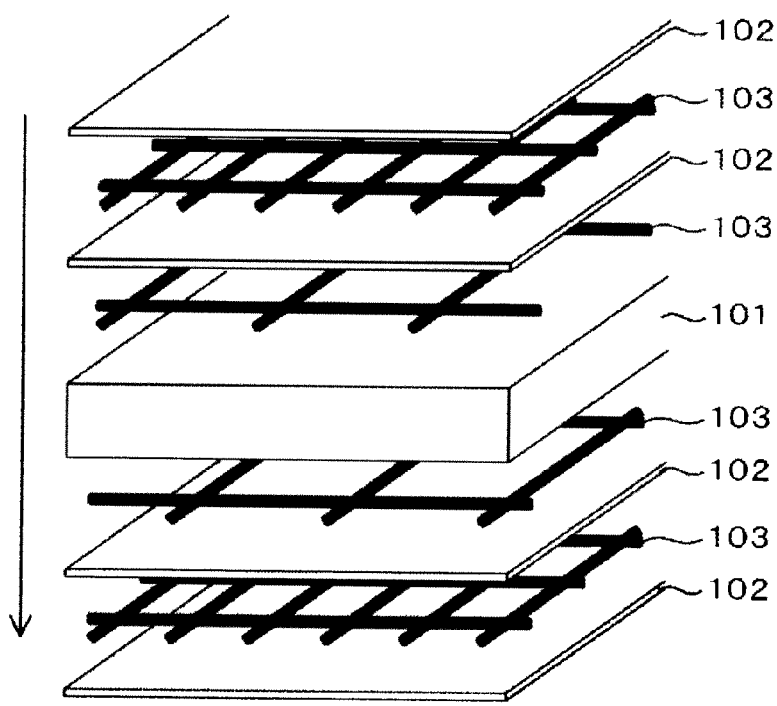
FIG. 8A illustrates a configuration of a wiring material according to a third embodiment of the present invention.
Figure 8B:
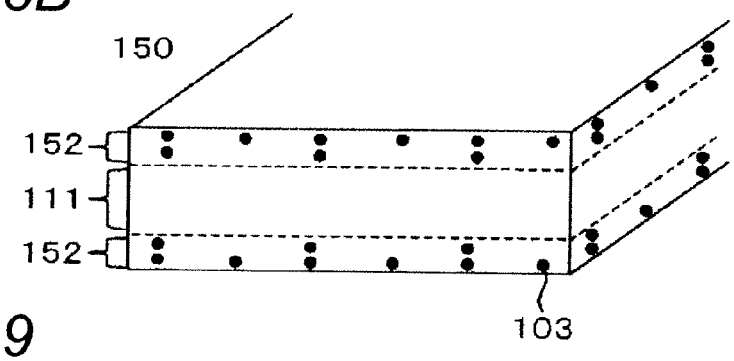
FIG. 8B illustrates a structure of the wiring material in FIG. 8A after heat pressure welding.

FIGS. 8A and 8B illustrate a configuration and a method of preparing a wiring material of a third embodiment of the present invention. A conductive thin plate 102 and a fiber layer in which fibers 103 having a thermal expansion coefficient lower than that of a core material are orthogonally arranged are sequentially stacked on both surfaces of a conductive core material 101 to compose a wiring material 150. As the core material 101, 99.95% pure oxygen-free copper having a size of 10 mm×50 mm×0.6 mm (thickness) is used, and as the conductive thin plate 102, 99.95% pure oxygen-free copper having a size of 10 mm×50 mm×0.04 mm (thickness) is used. As the fiber 103, an acrylic carbon fiber having a diameter of 0.04 mm is used. FIG. 8A illustrates a state in which four fiber layers composed of the fibers 103 are arranged in the clad layer and fiber density is changed in a thickness direction by making the number of fibers 103 in each layer different. Meanwhile, in FIGS. 8A and 8B, not a four-layer structure but a two-layer structure is simply illustrated; it should be noted that the structure in which the number of fibers 103 in each fiber layer is different is the same as that of the four-layer structure.

The number of fibers 103 arranged in a first fiber layer the closest to the core material 101 is 8 in a short side direction and 45 in a long side direction of the core material 101 and they are orthogonally arranged at regular intervals within a range of 10 mm×50 mm to form the fiber layer. In a second fiber layer subsequently stacked, the number of fibers 103 arranged is 13 in the short side direction and 68 in the long side direction, in a third fiber layer, the number of fibers 103 arranged is 17 in the short side direction and 91 in the long side direction, and in a fourth fiber layer, the number of fibers 103 arranged is 21 in the short side direction and 114 in the long side direction, respectively; they are orthogonally arranged at regular intervals within a range of 10 mm×50 mm. A surface of the fiber 103 is coated with SiC by a chemical vapor deposition method (CVD method).

The thin plate 102, the fourth fiber layer, the thin plate 102, the third fiber layer, the thin plate 102, the second fiber layer, the thin plate 102, the first fiber layer, the core material 101, the first fiber layer, the thin plate 102, the second fiber layer, the thin plate 102, the third fiber layer, the thin plate 102, the fourth fiber layer, and the thin plate 102 are stacked in this order to form a stacked body. The stacked body is pressure bonded by hot pressing for 20 minutes at a temperature of 1000° C. with a load of $30\times10^6$ Pa applied thereto in a reducing atmosphere of nitrogen and hydrogen.

As a result, the wiring material 100 is composed of the core layer 111 having a thickness of 0.6 mm and the clad layer 152 having a thickness of 0.2 mm on both surfaces of the core layer 111. At that time, a volume fraction of the carbon fiber 103 in the clad layer 152 is approximately 20% and the volume fraction of the carbon fiber 103 in the wiring material 150 is approximately 8%. Electrical conductivity of the wiring material 150 is measured to be approximately $54\times10^6$/mΩ in the long side direction. For comparison, electrical conductivity of Al having a size of 10 mm×50 mm×1 mm is measured to be $36\times10^6$/mΩ, so that the wiring material having electrical conductivity higher than that of Al is obtained. Since a surface of the obtained wiring material is Cu, a joining characteristic to a joint material is improved and surface treatment such as plating for preventing corrosion becomes easier. The thermal expansion coefficient of the clad layer 152 is a value within a range from $1\times10^{-6}$ to $10\times10^{-6}$/K.

In this embodiment, the volume fraction of the fiber 103 becomes larger with distance from the core layer 111, so that it becomes possible to decrease the thermal expansion coefficient of the clad layer 152 while maintaining high electrical conductivity in the vicinity of the core layer 111. Further, in a portion far from the core layer 111 in the clad layer 152, it is possible to decrease the thermal expansion coefficient in the vicinity of a portion connected to a semiconductor device and the like by increasing the volume fraction of the fiber 103, so that it is possible to decrease a strain on a joint interface to the semiconductor device while minimizing a used amount of the fiber 103.

As described above, in this embodiment, it becomes possible to provide the wiring material 150 having a low thermal expansion coefficient and high electrical conductivity while decreasing the fiber 103 as compared to that in the first embodiment.

[Fourth Embodiment]

Figure 2A:
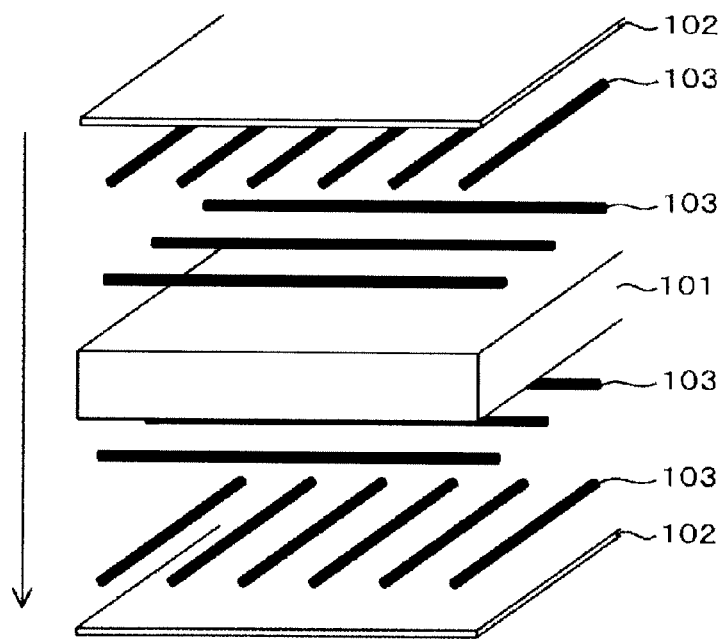
FIG. 2A illustrates a configuration of a wiring material according to a fourth embodiment of the present invention.
Figure 2B:
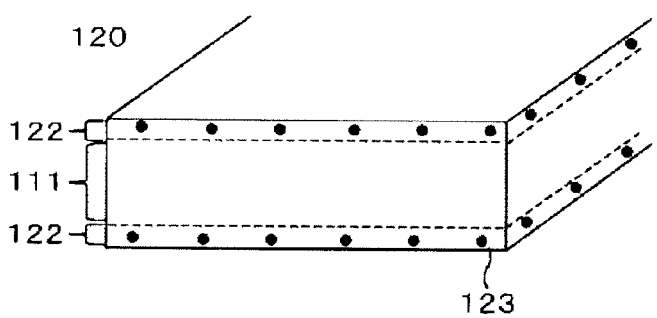
FIG. 2B illustrates a structure after heat pressure welding of the wiring material in FIG. 2B.

A configuration and a method of preparing a wiring material 120 illustrated in FIGS. 2A and 2B are described in this embodiment.

As illustrated in FIG. 2A, a conductive thin plate 102 and a fiber layer in which fibers 103 having a thermal expansion coefficient lower than that of a core material are arranged are sequentially stacked on both surfaces of a conductive core material 101 to compose the wiring material 120. As the core material 101, 99.95% pure oxygen-free copper having a size of 10 mm×50 mm×0.25 mm (thickness) is used, and as the conductive thin plate 102, 99.95% pure oxygen-free copper having a size of 10 mm×50 mm×0.1 mm (thickness) is used. As the fiber 103, a pitch-based carbon fiber having a diameter of 0.04 mm is used. The fiber layer is formed by orthogonally arranging 14 fibers 103 in a short side direction and 81 fibers 103 in a long side direction of the core material 101 at regular intervals within a range of 10 mm×50 mm. Further, although not illustrated, Cu metallization treatment is applied to a surface of the fiber 103.

The thin plate 102, the fiber layer, the fiber layer, the core material 101, the fiber layer, the fiber layer, and the thin plate 102 are stacked in this order to form a stacked body. The stacked body is pressure bonded by hot pressing for 20 minutes at a temperature of 1000° C. with a load of $30\times10^6$ Pa applied thereto in a reducing atmosphere of nitrogen and hydrogen. As a result, the wiring material 120 as illustrated in FIG. 2B is obtained. The wiring material 120 is composed of a core layer 111 having a thickness of 0.25 mm and a clad layer 122 having a thickness of 0.11 mm on both surface of the core layer 111. At that time, a volume fraction of the carbon fiber 103 in the clad layer 122 is approximately 10% and the volume fraction of the carbon fiber in the wiring material 120 is approximately 5%. Electrical conductivity of the wiring material 120 is measured to be approximately $56\times10^6$/mΩ in the long side direction. A thermal expansion coefficient of the clad layer 122 is set to a value within a range from $1\times10^{-6}$ to $10\times10^{-6}$/K. Further, since a surface of the obtained wiring material is Cu, a joining characteristic to a joint material is improved and surface treatment such as plating for preventing corrosion becomes easier.

As described above, in this embodiment, an effect similar to that obtained when a net-like fiber layer is used may be obtained also when not the net-like fiber layer but one simple fiber is used.

[Fifth Embodiment]

A configuration and a method of preparing a wiring material 130 illustrated in FIGS. 3A, 3B, 3C, and 3D are described in this embodiment.

Figure 3A:
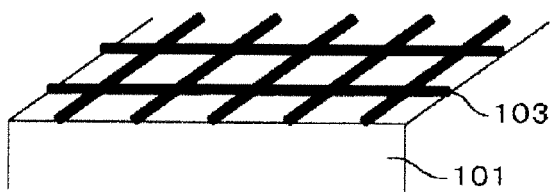
FIG. 3A illustrates a configuration of a wiring material of a fifth embodiment of the present invention before paste is applied.
Figure 3B:
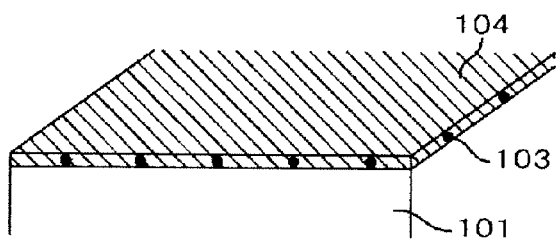
FIG. 3B illustrates the configuration of the wiring material of the fifth embodiment after the paste is applied.
Figure 3C:
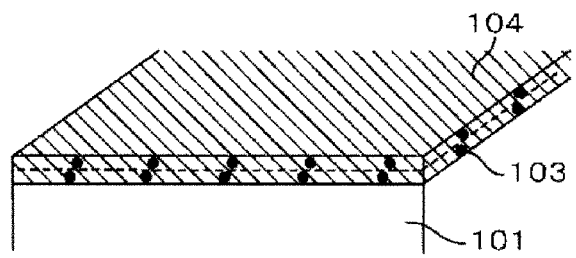
FIG. 3C illustrates the configuration of the wiring material of the fifth embodiment after the paste is applied twice.

In the wiring material 130, as a core material 101, 99.95% pure oxygen-free copper having a size of 10 mm×50 mm×0.25 mm (thickness) is used. As a fiber 103, a pitch-based carbon fiber having a diameter of 0.02 mm is used. FIG. 3A illustrates a state in which a fiber layer is formed by orthogonally arranging 43 fibers 103 and 225 fibers 103 in a short side direction and in a long side direction, respectively, of the core material 101 at regular intervals within a range of 10 mm×50 mm. Although not illustrated, Cu metallization treatment is applied to a surface of the fiber 103. As illustrated in FIG. 3B, a paste material obtained by dispersing copper oxide particles having an average particle diameter of 0.05 mm or smaller in toluene is applied to fill the fiber layer so as to form a clad layer 132 and allow the core material 101 and the fiber layer to be closely adhered to each other. Since two fiber layers are stacked, the paste is applied twice as illustrated in FIG. 3C in this embodiment.

Figure 3D:
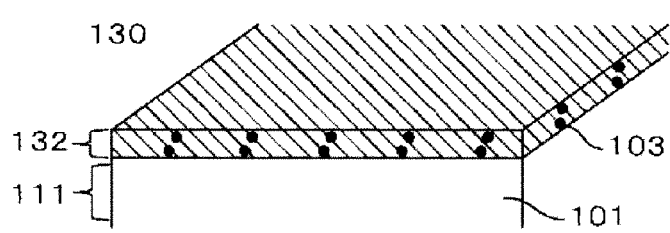
FIG. 3D illustrates a structure after heat pressure welding of the wiring material in FIG. 3C.
Figure 4A:
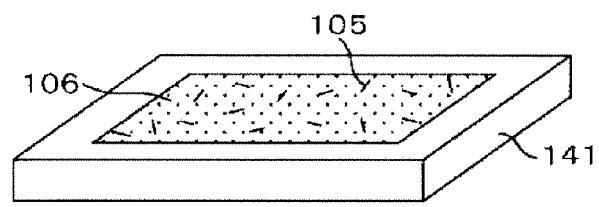
FIG. 4A illustrates a method of preparing a sheet material 142 according to a sixth embodiment of the present invention.
Figure 4B:
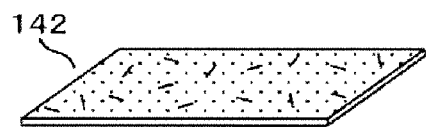
FIG. 4B illustrates the sheet material 142.
Figure 4C:
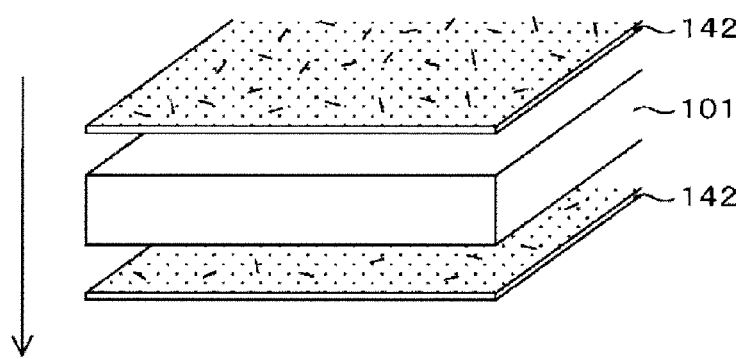
FIG. 4C illustrates a configuration of a wiring material according to the sixth embodiment.
Figure 4D:
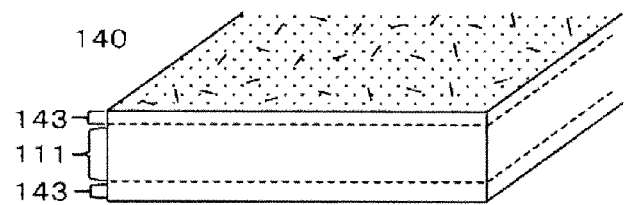
FIG. 4D illustrates a structure of the sheet material in FIG. 4A after heat pressure welding.

A stacked body obtained by stacking the fiber layer, a paste layer 104, the fiber layer, and the paste layer 104 in this order on one surface of the core material 101 is heated in a hydrogen atmosphere for five minutes at a temperature of 350° C. At the time of heating, a SiN flat plate is put on the paste layer 104 to apply a pressure of $1 \times 10^6$ Pa. After application of heat and pressure is finished, the SiN flat plate is removed and the wiring material 130 illustrated in FIG. 3D is obtained. The wiring material 130 is composed of a core layer 111 having a thickness of 0.25 mm and the clad layer 132 having a thickness of 0.1 mm on one surface of the core layer 111. At that time, a volume fraction of the carbon fiber 103 in the clad layer 132 is approximately 15% and the volume fraction of the carbon fiber 103 in the wiring material 130 is approximately 4%. Electrical conductivity of the wiring material 130 is measured to be approximately $53 \times 10^6$/mΩ in the long side direction. Further, a thermal expansion coefficient of the clad layer 132 is set to a value within a range from $1 \times 10^{-6}$ to $10 \times 10^{-6}$/K.

It is possible to provide the wiring material 130 having a low thermal expansion coefficient and high electrical conductivity as in the first embodiment also by using the paste material as in this embodiment.

[Sixth Embodiment]

In this embodiment, a configuration and a method of preparing a wiring material 140 illustrated in FIGS. 4A, 4B, 4C, and 4D are described.

First, a mixed power of a 1 to 1.5 mm-length acrylic carbon fiber 105 having a diameter of 0.01 mm and a copper powder 106 having a particle diameter of 0.02 mm or smaller are prepared for preparing a clad layer 143. A surface of the fiber 105 is coated with SiC by a chemical vapor deposition method (CVD method). A volume ratio of the fiber 105 to the copper powder 106 is set to 0.2:0.8. The mixed powder 106 is put in a mold 141 having a size of 50 mm×10 mm×0.15 mm to form a preform, and this is baked by hot pressing for 15 minutes at a temperature of 1000° C. with a load of $50 \times 10^6$ Pa applied thereto in a reducing atmosphere of nitrogen and hydrogen. After the baking, a sheet material 142 having a size of 50 mm×10 mm×0.15 mm is obtained. Length directions of the acrylic carbon fibers 105 in the sheet material 142 are substantially the same as an in-plane direction of the sheet material 142 and are not oriented in a specific direction. A volume fraction of the acrylic carbon fiber 105 in the sheet material 142 is approximately 20%.

Next, the obtained sheet material 142 is closely adhered to both surfaces of a core material 101 to prepare the wiring material. As the core material 101, 99.95% pure oxygen-free copper having a size of 10 mm×50 mm×0.25 mm (thickness) is used. A stacked body obtained by stacking the sheet material 142, the core material 101, and the sheet material 142 in this order is pressure bonded by hot pressing for 20 minutes at a temperature of 1000° C. with a load of $30 \times 10^6$ Pa applied thereto in the reducing atmosphere of nitrogen and hydrogen, and the wiring material 140 is obtained. The wiring material 140 is composed of a core layer 111 having a thickness of 0.5 mm and the clad layer 142 having a thickness of 0.2 mm on both surfaces of the core layer 111. At that time, the volume fraction of the acrylic carbon fiber 105 in the clad layer 143 is approximately 16% and the volume fraction of the carbon fiber 103 in the wiring material 140 is approximately 4%. Electrical conductivity of the obtained wiring material 140 is measured to be approximately $57 \times 10^6$/mΩ in a long side direction. A thermal expansion coefficient of the clad layer 143 is set to a value within a range from $1 \times 10^{-6}$ to $10 \times 10^{-6}$/K.

By this embodiment, need for aligning the fibers 103 in a predetermined direction as in the first embodiment is eliminated, so that the clad layer 142 may be more easily prepared. Further, need for using the orthogonally arranged fibers 103 as described in the first embodiment is eliminated, so that it becomes possible to provide the wiring material at a lower cost than in the first embodiment.

[Seventh Embodiment]

In this embodiment, a configuration of a semiconductor module 200 in which a wiring material prepared in the first embodiment is used as wiring is described.

Figure 5A:
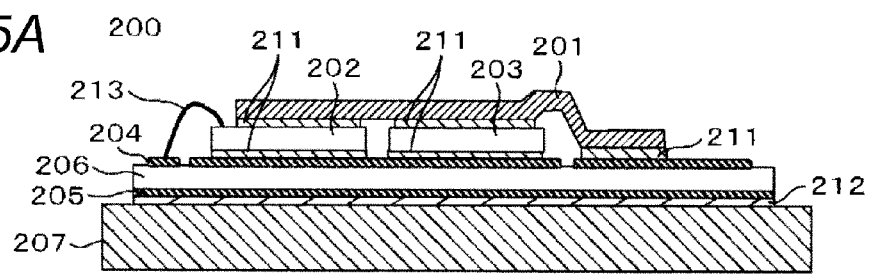
FIG. 5A is a cross-sectional view of a semiconductor module 200 on which wiring 201 is mounted according to a seventh embodiment of the present invention.
Figure 5B:
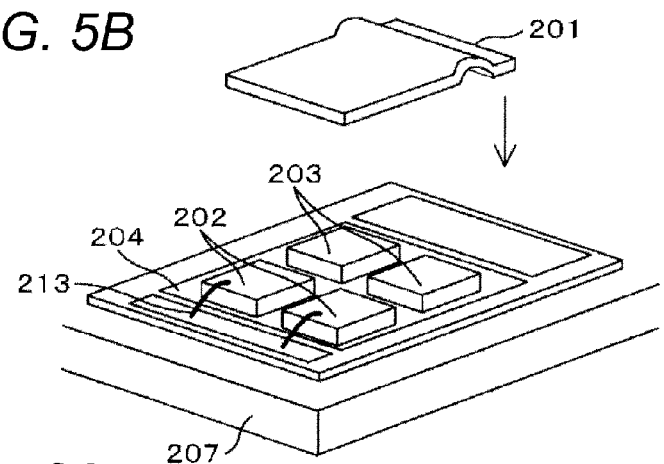
FIG. 5B illustrates a state in which the wiring 201 is mounted on the semiconductor module 200.

FIGS. 5A and 5B are views illustrating the configuration of the semiconductor module 200 according to this embodiment.

FIG. 5A is a cross-sectional view of the semiconductor module 200 on which wiring 201 is mounted. An insulating circuit substrate obtained by attaching metal layers 204 and 205 serving as circuits on one surface and the other surface of a ceramic substrate 206 is joined onto a radiating base substrate 207 through a joint layer 212. Electrode surfaces of a switching device (IBGT) 202 and a diode 203 are joined onto the metal layer 204 on the surface of the ceramic substrate 206 through a joint layer 211. Further, a gate terminal, which controls switching operation of the IGBT 202, is provided on an electrode surface opposite to the surface, which is in contact with the circuit substrate, of the IGBT 202 and the gate terminal and a control circuit unit on the circuit substrate are connected to each other by a wire 213. The IGBT 202, the diode 203, and a part of the insulating circuit substrate are connected to the wiring 201 composed of the wiring material. The wiring 201 is connected to each semiconductor device and the insulating circuit substrate through the joint layer 211.

A size and a material of each member are as follows. The radiating base substrate 207 is an aluminum/silicon carbide (Al—SiC) plate having a size of 100 mm×100 mm×5 mm and the insulating circuit substrate is a substrate obtained by attaching Cu foil having a size of 50 mm×50 mm×0.2 mm on one surface of an AlN plate having a size of 50 mm×50 mm×0.635 mm and attaching Cu foil obtained by processing a circuit pattern having an outermost shape of 48 mm×48 mm×0.3 mm on the other surface thereof. The radiating base substrate 207 and the ceramic substrate 206 are joined to each other by the joint layer 212 being SnCu-based sheet solder having a size of mm×50 mm×0.2 mm. The IGBT and the diode are Si semiconductor devices having a size of 14 mm×14 mm×0.4 mm. The wire 213 is an Al wire having a diameter of 0.4 mm. The joint layer 211 is a sintered silver layer having a thickness of 0.02 mm. The wiring 201 is obtained by bending a part of the wiring material prepared in the first embodiment.

A preparing method is hereinafter described. A joint material is applied to joining positions of two IGBTs 202 and two diodes 203 on the insulating circuit substrate composed of the metal layers 204 and 205 and the ceramic substrate 206. The joint material is applied to the wiring 201 in the joining positions of the devices and the circuit substrate. Herein, a paste material obtained by dispersing silver oxide particles having an average particle diameter of 0.1 mm or smaller in toluene is used as the joint material. Further, as illustrated in FIG. 5B, the insulating circuit substrate, the IGBT 202 and the diode 203, and the wiring 201 are mounted in this order such that the applied position of the joint material and the position of the device are aligned with each other. This is heated and pressurized with a load of $0.2 \times 10^6$ Pa per one device for five minutes at 250° C. in an air atmosphere to prepare an insulating circuit substrate/device/wiring joint product. The gate terminal of the IGBT 202 and the control circuit unit on the circuit substrate are joined to each other by means of the Al wire using an ultrasonic joining method. The obtained joint product is arranged on the base substrate 207 through the sheet solder 212 to be heated for five minutes at 300° C. in a hydrogen atmosphere, and the semiconductor module 200 is obtained.

The prepared semiconductor module 200 is put in a temperature cycle test (−45° C. to 150° C., 2000 cycles, and five samples are put). As a result of cross-sectional observation of a joint interface between the IGBT 202 and the wiring 201 and that between the diode 203 and the wiring 201 using a scanning electron microscope (SEM), no crack is observed on the joint interface and the joint layer. No change in electric property and heat-transfer property before and after the test is observed.

For comparison, the semiconductor module 200 in which the wiring 201 is replaced with Cu having a thickness of 0.5 mm is prepared to be put in the temperature cycle test; a 2 to 5 mm-length crack from a device end portion is observed in the vicinity of the interface between the wiring 201 and the joint layer 211 and both of the electric property and the heat-transfer property are deteriorated as compared to those before the test.

From the above-described result, it becomes possible to decrease a stress applied to the joint part to the semiconductor device and a highly reliable semiconductor module may be realized by using the wiring material of this embodiment.

[Eighth Embodiment]

In this embodiment, a configuration of a semiconductor module 220 in which a base substrate 207 and metal layers 204 and 205 of an insulating circuit substrate are replaced with a wiring material 201 of the present invention in a semiconductor module prepared in the seventh embodiment is described. Another member and preparing method are the same as those of the seventh embodiment, so that difference is described.

Figure 9:
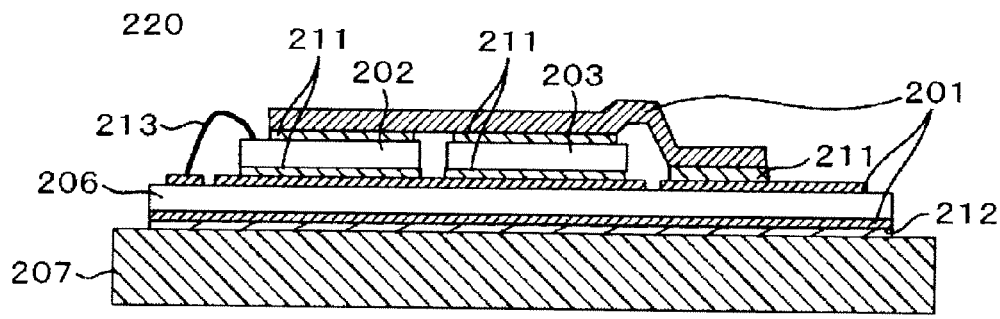
FIG. 9 illustrates a configuration of a semiconductor module according to an eighth embodiment of the present invention.

FIG. 9 illustrates the semiconductor module 220 according to this embodiment. The base substrate 207 is prepared by a method similar to that of a wiring material according to the seventh embodiment. A clad layer having a thickness of 1 mm is formed on both surfaces of a core material having a thickness of 3 mm. The clad layer is formed by stacking five sheet materials having a thickness of 0.2 mm obtained by sintering a mixed power of a 1 to 1.5 mm-length acrylic carbon fiber having a diameter of 0.01 mm and a copper powder. An average volume fraction of the fiber in the clad layer is approximately 15%.

Each of the metal layers 204 and 205 of the insulating circuit substrate is obtained by forming the clad layer having a thickness of 0.125 mm on both surfaces of a core material having a thickness of 0.25 mm. In the clad layer, the acrylic carbon fibers having a diameter of 0.02 mm are arranged in two orthogonal directions and a volume fraction thereof in the clad layer is approximately 10%. The wiring material processed into a circuit pattern shape in advance is attached to the metal layer 204.

A paste material obtained by mixing a copper oxide particle and an $Al_2O_3$ particle is applied and sintered to form joint layers 211 and 212. An application amount and a pressure to be applied are adjusted such that a thickness of the joint layer 211 is set to 0.05 mm and a thickness of the joint layer 212 is set to 0.1 mm.

The prepared semiconductor module 220 is put in a temperature cycle test (−45° C. to 150° C., 2000 cycles, and five samples are put). As a result of cross-sectional observation of a joint interface between an IGBT 202 and the wiring 201 and that between a diode 203 and the wiring 201, the joint interface between the IGBT 202 and the insulating circuit substrate, the joint interface between the diode 203 and the insulating circuit substrate, and the joint interface between the insulating circuit substrate and the base substrate 207 using a scanning electron microscope (SEM), no crack is observed on the joint interface and the joint layer. No change in electric property and heat-transfer property is observed.

From the above-described result, it becomes possible to decrease a stress applied to the joint part of each member by using the wiring material of this embodiment as a circuit wiring material and a radiating base substrate and a highly reliable semiconductor module may be realized. Meanwhile, when the wiring material of this example is used as the radiating base substrate, since Cu is used as a core layer and the clad layer, there is an advantage that thermal conductivity is higher than that of Al—SiC being a conventional low thermal expansion material and that a shearing stress on the joint interface may be decreased as compared to that of conventional Cu having high thermal conductivity.

[Ninth Embodiment]

A configuration in which a prepared wiring material is applied to a semiconductor module 300 as in the fifth embodiment is described in this embodiment.

Figure 6A:
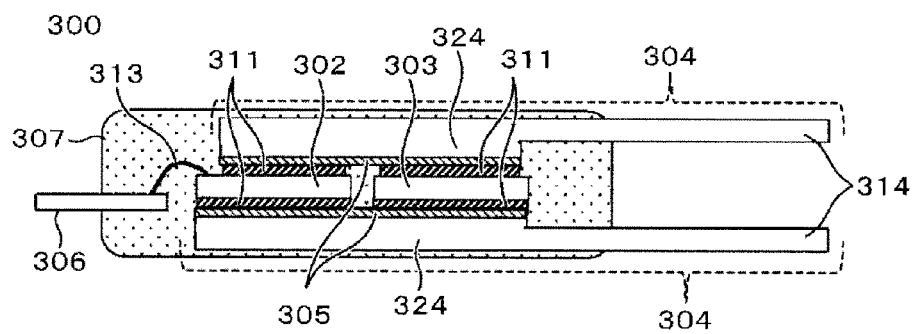
FIG. 6A is a cross-sectional view of a semiconductor module 300 on which a lead 304 is mounted according to a ninth embodiment of the present invention.
Figure 6B:
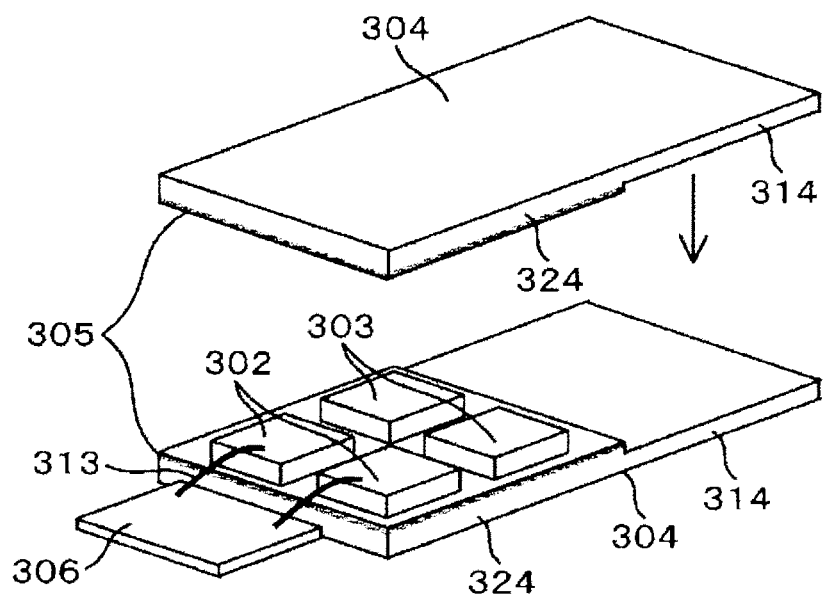
FIG. 6B illustrates a state in which the lead 304 is mounted on the semiconductor module 304.

FIGS. 6A and 6B are views illustrating a configuration of the semiconductor module 300 according to this embodiment. FIG. 6A is a cross-sectional view of the semiconductor module on which a lead 304 having the wiring material described in the fifth embodiment as wiring is mounted. The lead 304 is joined to both surfaces of an IGBT 302 and a diode 303 through a joint layer 311. A gate terminal of the IGBT 302 and a terminal 306 connecting to an external control circuit are connected to each other by a wire 313. Further, sealing with a resin 307 is performed for insulating each lead 304 and a device electrode. A Si semiconductor device having a size of 13 mm×13 mm×0.1 mm is used as the IGBT 302 and the diode 303, the wire 313 is made of Al having a diameter of 0.3 mm, and an epoxy resin is used as the insulating resin 307. The joint layer 311 is a sintered silver layer having a thickness of 0.03 mm.

A method of preparing the lead 304 is hereinafter described. Oxygen-free copper having a thickest portion 324 of 1.5 mm and a thinnest portion 314 of 1 mm is applied. The devices 302 and 303 are interposed between the thickest portions 324 to be joined. Therefore, a clad layer having a thickness of 0.1 mm is provided on a surface of the thickest portion 324. A structure and a method of preparing the clad layer are the same as those of the fifth embodiment, for example, so that description thereof is not repeated. A volume fraction of a carbon fiber 103 in a clad layer 112 of the prepared lead 304 is approximately 15%.

A method of preparing the semiconductor module 300 is hereinafter described. A paste material obtained by dispersing silver oxide particles having an average particle diameter of 0.1 mm or smaller in toluene is applied to a region on the lead 304 to which the IGBT 302 and the diode 303 are joined. As illustrated in FIG. 6B, the lead 304 to which the paste material is applied is arranged on both surfaces of the IGBT 302 and the diode 303, they are heated and pressurized with a load of $0.5 \times 10^6$ Pa per one device for five minutes at 250° C. in an air atmosphere to prepare a joint product. The gate terminal of the IGBT 302 and the terminal 306 connecting to the external control circuit are connected to each other by the wire 313 using an ultrasonic joining method. Then, the semiconductor module 300 is obtained by sealing with the resin 307 using a transfer molding method.

The prepared semiconductor module 200 is put in a temperature cycle test (−45° C. to 150° C., 2000 cycles, and five samples are put). As a result of cross-sectional observation of a joint interface between the IGBT 302 and the lead 304 and the joint interface between the diode 303 and the lead 304 using a scanning electron microscope (SEM), no crack is observed on the joint interface and the joint layer. No change in electric property and heat-transfer property before and after the test is observed.

From the above-described result, it becomes possible to decrease a stress applied to a joint part to each semiconductor device by using the clad layer as the lead formed in the region joining to the semiconductor device, thereby realizing a highly reliable semiconductor module.

[Tenth Embodiment]

A configuration of an LED module in which a wiring material prepared in the same manner as in the fifth embodiment is used as a radiating base is described in this embodiment.

Figure 7A:
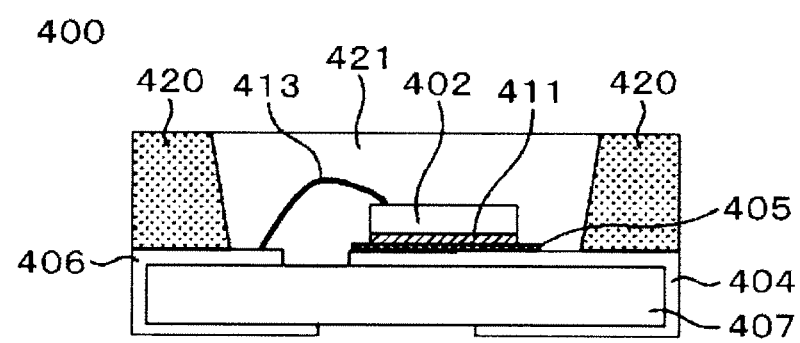
FIG. 7A is a cross-sectional view of an LED module 400 in which a wiring material according to a tenth embodiment of the present invention is used.
Figure 7B:
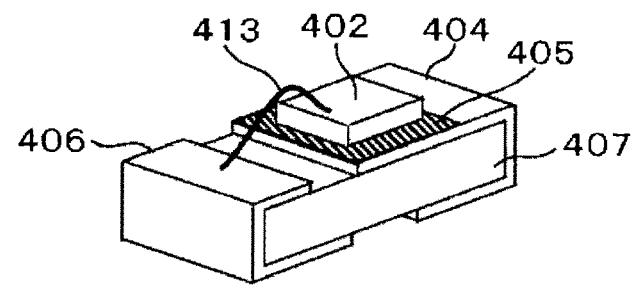
FIG. 7B is a perspective view of the LED module 400.

FIGS. 7A and 7B are views illustrating a configuration of an LED module 400 according to this embodiment. FIG. 7A is a cross-sectional view of the LED module 400 in which the wiring material described in the fifth embodiment and the like is used. A resin reflecting plate 420 is formed on an outer peripheral portion of an insulating circuit substrate on which an LED device 402 is mounted and a peripheral portion of the LED device 402 is sealed with a transparent resin. Copper wiring 404 and copper wiring 406 having a thickness of 0.2 mm are formed on a surface of an $Al_2O_3$ substrate 407 for heat radiation and insulation as insulating circuit substrates. Further, a clad layer 405 having a thickness of 0.1 mm is formed on a surface on which the wiring 404 and the LED device 402 are joined to each other. The clad layer 405 is prepared by a forming method similar to that of the fifth embodiment. Paste containing a copper particle is applied to two carbon fiber layers arranged in orthogonal two directions to be sintered. A volume fraction of the carbon fiber in the clad layer is set to be approximately 10%. FIG. 7B is a perspective view of the LED module 400. One electrode surface of the LED device 402 is joined onto the clad layer wiring 404 through a joint layer 411. An electrode terminal provided on the other side of the LED device 402 is connected to the wiring 406 by an Al wire 413. The joint layer 411 is a sintered silver layer having a thickness of 0.02 mm.

The prepared LED module 400 is put in a temperature cycle test (−45° C. to 85° C., 2000 cycles, and 10 samples are put). As a result of cross-sectional observation of a joint interface between the LED device 402 and the circuit wiring 404 using a scanning electron microscope (SEM), no crack is observed on the joint interface and the joint layer. No change in heat-transfer property of the insulating circuit substrate and amount of luminescence of the LED before and after the test is observed. Therefore, it becomes possible to provide a highly reliable LED module 400 having a low thermal expansion coefficient and high electrical conductivity.

Although the examples are described above, the present invention is not limited thereto and it is obvious for one skilled in the art that various changes and modifications may be made without departing from the spirit and attached claims of the present invention.

REFERENCE SIGNS LIST 100 wiring material
101 core material
102 conductive thin plate
103 fiber
111 core layer
112, 122, 132, 143, 152, 305 clad layer

The invention claimed is:

1. A wiring material, comprising:
   a core layer made of metal; and
   a clad layer made of metal and a fiber, wherein
   the core layer is copper or an alloy containing copper,
   the clad layer is formed of copper or the alloy containing copper and the fiber having a thermal expansion coefficient lower than a thermal expansion coefficient of copper,
   the wiring material has a stacked structure in which at least one surface of the core layer is closely adhered to the clad layer,
   the fiber in the clad layer is arranged so as to be parallel to the surface of the core layer,
   the fiber includes a fiber layer formed of a fiber arranged so as to be parallel to one direction and the fiber arranged in a direction perpendicular to the fiber arranged so as to be parallel to the one direction, and
   volume density of the fiber in the fiber layer increases with distance from the core layer in a stacking direction in the wiring material.

2. The wiring material according to claim 1, wherein the fiber layer is formed of a first fiber layer arranged so as to be parallel to one direction and a second fiber layer arranged in a direction perpendicular to the one direction.

3. The wiring material according to claim 1, wherein the clad layer includes a plurality of fiber layers and the plurality of fiber layers are stacked in the stacking direction, and the fiber layers are arranged such that the number of fibers increases with distance from the core layer in the stacking direction in the wiring material.

4. The wiring material according to claim 1, wherein the fiber has an aspect ratio of 100 or larger.

5. The wiring material according to claim 1, wherein a thickness of the clad layer is 1/10 to 1/2 of a thickness of the core layer.

6. The wiring material according to claim 1, wherein a thickness of the clad layer is not larger than a thickness of the core layer.

7. The wiring material according to claim 1, wherein a volume fraction of the fiber in the clad layer is 5 to 30%.

8. The wiring material according to claim 1, wherein a thermal expansion coefficient of the clad layer in a direction perpendicular to a direction in which the core layer and the clad layer are stacked is $1\times10^{-6}$ to $10\times10^{-6}$/K and electrical conductivity in the clad layer is $40\times10^6$ to $60\times10^6$/mΩ.

9. Semiconductor equipment, comprising:
a wiring material including a core layer made of metal and a clad layer made of metal and a fiber;
a semiconductor device including an electrode; and
an insulating circuit substrate including a metal layer, wherein
the clad layer is formed of copper or an alloy containing copper and a fiber having a thermal expansion coefficient lower than a thermal expansion coefficient of copper,
the wiring material has a stacked structure in which at least one surface of the core layer is closely adhered to the clad layer,
the semiconductor device is mounted on the insulating circuit substrate,
an electrode of the semiconductor device and the core layer of the wiring material are connected to each other through the clad layer,
the metal layer of the insulating circuit substrate and the core layer of the wiring material are connected to each other through the clad layer,
the fiber in the clad layer is arranged so as to be parallel to the surface of the core layer,
the fiber includes a fiber layer formed of a fiber arranged so as to be parallel to one direction and the fiber arranged in a direction perpendicular to the fiber arranged so as to be parallel to the one direction, and
volume density of the fiber in the fiber layer increases with distance from the core layer in a stacking direction in the wiring material.

10. The semiconductor module according to claim 9, wherein
the fiber has an aspect ratio of 100 or larger.

11. The semiconductor module according to claim 9, wherein
a thickness of the clad layer is not larger than a thickness of the core layer.

12. The semiconductor module according to claim 9, wherein
a volume fraction of the fiber in the clad layer is 5 to 30%.

13. The semiconductor module according to claim 9, wherein
the wiring material is such that a thermal expansion coefficient of the clad layer in a direction perpendicular to a direction in which the core layer and the clad layer are stacked is $1\times10^{-6}$ to $10\times10^{-6}$/K and electrical conductivity in the clad layer is $40\times10^6$ to $60\times10^6$/mΩ.

14. The semiconductor module according to claim 9, wherein
the insulating circuit substrate has a thermal expansion coefficient of $10\times10^{-6}$ or lower.

15. The semiconductor module according to claim 9, wherein
the insulating circuit substrate has a thermal expansion coefficient of $2\times10^{-6}$ to $8\times10^{-6}$/K.

* * * * *